United States Patent [19]

Guilmette et al.

[11] Patent Number: 4,551,197
[45] Date of Patent: Nov. 5, 1985

[54] METHOD AND APPARATUS FOR THE RECOVERY AND RECYCLING OF CONDENSABLE GAS REACTANTS

[76] Inventors: Joseph G. Guilmette, 38 Rice Rd.; Robert C. Wright, 307 Main St., both of Hingham, Mass. 02043

[21] Appl. No.: 634,635

[22] Filed: Jul. 26, 1984

[51] Int. Cl.⁴ .............. H01L 21/306; B44C 1/22; C03C 15/00; C23F 1/02
[52] U.S. Cl. .................... 156/642; 62/55.5; 156/345
[58] Field of Search ............... 156/642, 345; 62/55.5; 134/10-12

[56] References Cited

U.S. PATENT DOCUMENTS

| | | | |
|---|---|---|---|
| 1,553,321 | 9/1925 | Meiklejohn | 148/1 |
| 2,235,658 | 2/1938 | Waterman | 148/8 |
| 2,831,549 | 4/1958 | Alpert | 183/4 |
| 2,948,392 | 8/1984 | Young | 206/84 |
| 3,103,108 | 9/1963 | Santeler | 62/268 |
| 3,216,207 | 11/1965 | Boyer et al. | 62/42 |
| 3,721,100 | 3/1973 | Bovio | 62/55.5 |
| 3,859,807 | 1/1975 | Benedict et al. | 62/55.6 |
| 4,072,025 | 2/1978 | Thibault | 62/55.5 |
| 4,117,694 | 10/1978 | Belmore | 62/55.5 |
| 4,190,488 | 2/1980 | Winters | 156/643 |
| 4,468,283 | 8/1984 | Ahmed | 156/642 |

Primary Examiner—William A. Powell
Attorney, Agent, or Firm—Robert L. Goldberg

[57] ABSTRACT

A cold trap system is disclosed for recovering and recycling condensable gas reactants, such as xenon difluoride. Continuous recovery and recycling is achieved through a system including a plurality of cold traps and a storage chamber having a single input/output access pipe.

20 Claims, 2 Drawing Figures

METHOD AND APPARATUS FOR THE RECOVERY AND RECYCLING OF CONDENSABLE GAS REACTANTS

BACKGROUND OF THE INVENTION

This invention relates to a method and apparatus for recovering and recycling condensable reactants in a chemical process, particularly those used in the manufacture of semiconductor chips.

Until recently, compounds of noble gases, such as helium, neon, argon, xenon and krypton were considered impossible to achieve. When they were initially discovered, they were considered to be only scientific curiosities. Only recently has it been discovered that these materials can be useful in solving difficult problems encountered in the fabrication of semiconductor devices. For instance, in U.S. Pat. No. 4,190,488 by Harold F. Winters a method for using noble gas halides, particularly $XeF_2$, as an etchant for silicon and various metals is described. This method has particular advantages for the production of high density semiconductor arrays used in advanced information handling technology. The noble gas halides are very expensive compounds. Therefore, it is desirable to recover any of the noble gas halide that is unreacted for reuse. To make effective reuse of an unreacted noble gas halide the reaction products from the etching process must be separated out.

There are many chemical processes which would benefit from a method of recovering expensive or toxic reactants. A further example from the semiconductor manufacturing industry are processes for depositing silicon onto a semiconductor device. Silane ($SiH_4$) is an expensive reactant used in this process. By recovering and reusing unreacted silane the costs of manufacturing can be reduced. Another process that would benefit from the recovery of reactants is the production of helium arsenide. Arsine is a toxic reactant in this process which is often disposed of when unreacted. The ability to recycle unreacted arsine would provide a more efficient production process.

SUMMARY OF THE INVENTION

The method of the present invention for recovering noble gas halides introduces the use of a cold trap. Unreacted noble gas halide is condensed on a cold surface while the remaining reaction products are pumped away. The surface is warmed and the noble gas halide is allowed to be readmitted into the reaction chamber for reuse. The apparatus for accomplishing the method of the invention includes a reaction chamber, a cold trap, a pump and valves between the elements of the apparatus to control the flow of the gases.

The present invention further includes a method for the continuous recovery and recycling of a condensable gas reactant. This is made possible through the simultaneous use of a plurality of cold traps. A primary object and advantage of the present invention is the minimization of the cost of using an expensive gas reactant by providing a means for recovering unreacted gas for reuse. A storage chamber provides efficient return of recovered reactant to the reaction chamber through its single access pipe.

Other objects and advantages of the invention become apparent during the following description of the presently preferred embodiments of the invention taken in conjunction with the drawings.

DETAILED DESCRIPTION OF THE PREFERRED EMBODIMENTS

Figure 1:
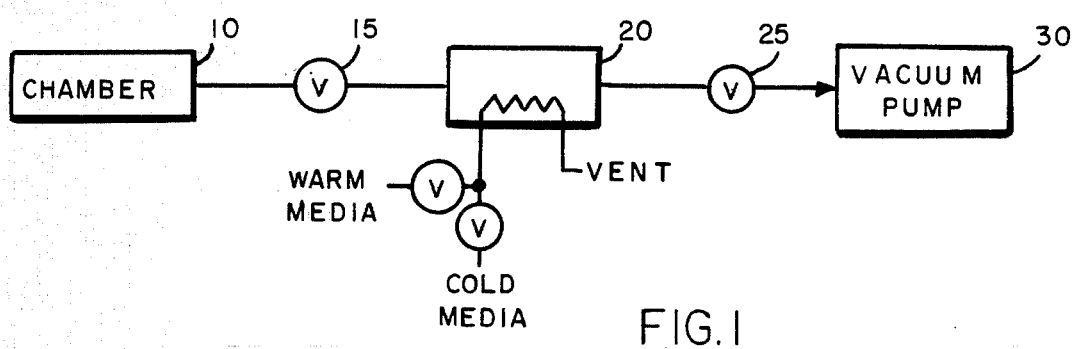
FIG. 1 is a schematic diagram of a noble gas halide recovery system of the present invention.

Turning now to the drawings, FIG. 1 is a simplified schematic of a noble gas halide recovery system. A reaction chamber 10 is provided for the manufacturing process of reacting a noble gas halide with a substrate. For example, if $XeF_2$, xenon difluoride, were used as an etchant to react with a substrate such as silicon in the production of a semiconductor chip, the reaction which occurs in the chamber produces the reaction products $SiF_4$ and xenon. Unreacted xenon difluoride must be separated out from these reaction products. A valve 15 allows the reaction products and unreacted gases to flow into a cold trap 20. Since the vapor pressure curve of xenon difluoride as a function of temperature is far lower than that of either silicon tetrafluoride or xenon, unreacted xenon difluoride can be removed by condensation on the cold surfaces. A valve 25 is open allowing a vacuum pump 30 to pull the reaction products through the cold trap 20. To summarize, the gases in the reaction chamber 10 are pulled through the cold trap 20 by vacuum pump 30, the unreacted xenon difluoride condensing on the surface of the cold trap 20 thereby becoming separated from the reaction products.

After a sufficient quantity of unreacted xenon difluoride has been accumulated on the cold surface, the valve 25 is closed and the cold surface is warmed to raise the vapor pressure of the xenon difluoride to the degree necessary for its readmission into the reaction chamber 10. The reaction may then be repeated with the replenished supply of xenon difluoride.

Figure 2:
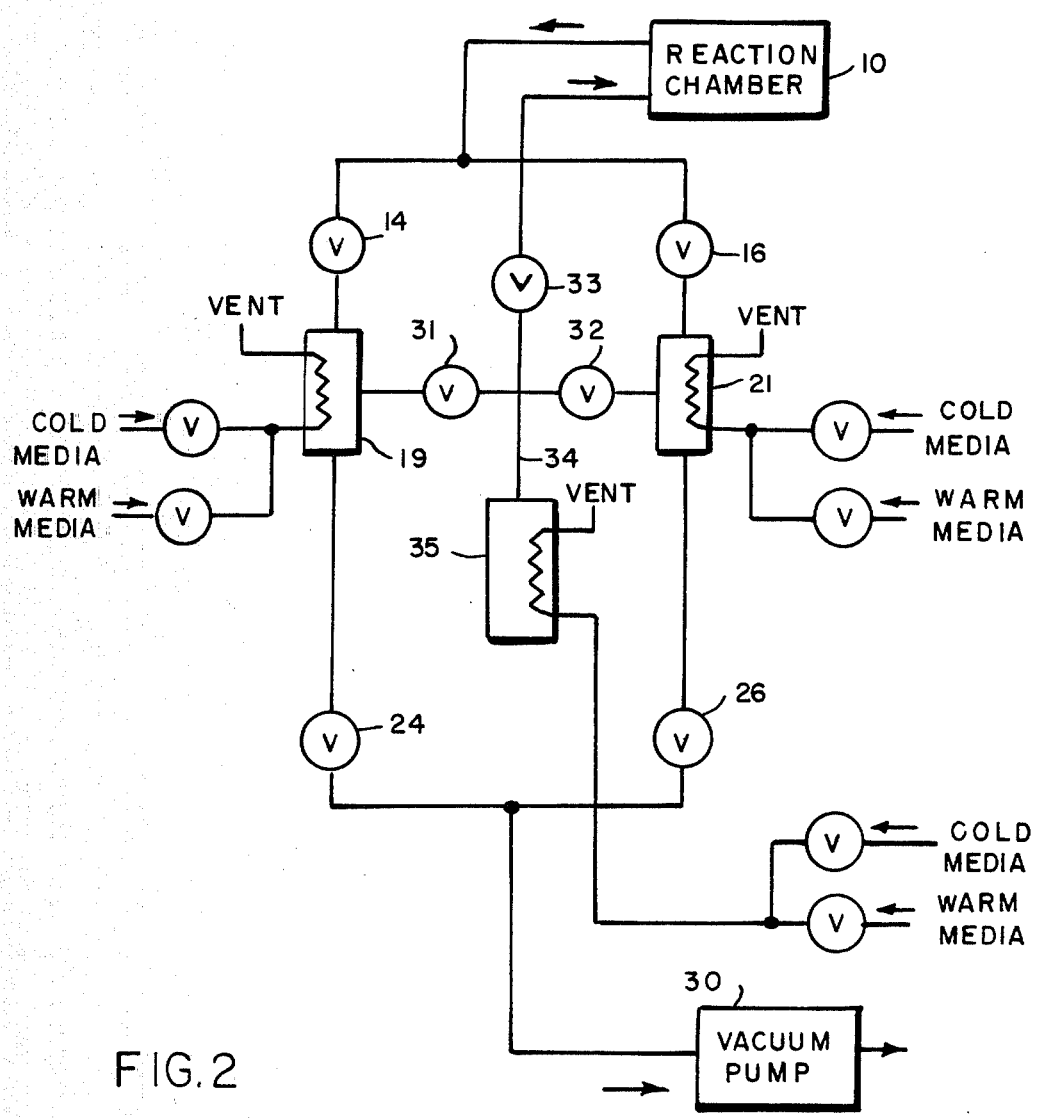
FIG. 2 is a schematic diagram of a continuous recovery system for condensable gas reactants of the present invention.

Referring now to FIG. 2, a system for the continuous recovery and recycling of condensable gas reactants is shown. The desired manufacturing process occurs in the reaction chamber 10. The continuous recovery system may be used with such processes as etching semiconductor chips with xenon difluoride or using silane to deposit silicon on a semiconductor chip. Gases exiting from the reaction chamber 10 are directed into one or more of a plurality of cold traps. In the embodiment of FIG. 2, gases will be allowed to travel through either valve 14 or valve 16 to cold trap 19 or cold trap 21. The cold traps are provided with heating and cooling means. Any conventional means of heating or cooling may be used. In the presently preferred embodiment, a cold media whose temperature is controlled, liquid nitrogen for example, is directed through a pipe in the cold trap to cool the collecting surface. To heat the cold trap, input valves switch the input media to warm air for heating the collecting surface.

In order to collect an unreacted condensable gas from the reaction chamber 10 in cold trap 19, valves 14 and 24 would be open, thereby allowing vacuum pump 30 to pull the reaction products and unreacted gases through the cold trap 19. A gas reactant having a lower vapor pressure curve than the reaction products will condense on the collection surface of the cold trap. After a sufficient quantity of unreacted gas reactant, such as xenon difluoride has been accumulated on the collection surface of the cold trap 19, valves 14 and 24 are closed. The cold media being supplied through the cold trap is turned off and warm media is allowed to heat the collection surface. Meanwhile, a storage chamber 35 is cooled in preparation for receiving the collected gas reactant from the cold trap 19. The storage chamber 35 has a single access pipe 34 which is connected to each of the plurality of cold traps and to the reaction chamber 10 through valve means. In FIG. 2, the storage chamber 35 is connected via valve 31 to cold trap 19 and via valve 32 to cold trap 21. Valve 33 connects the storage chamber 35 with the reaction chamber 10 for returning the recovered reactant back into the process.

To fill the storage chamber 35, the valve 31 to cold trap 19 is opened and the remaining valves 32 and 33 are closed. The increased pressure in cold trap 19 caused by the heating of the trap causes the recovered gas reactant to move from the warm trap 19 into the cold storage chamber 35. The reactant then condenses on the surface of the storage chamber 35. After sufficient amount of gas reactant is collected in the storage chamber 35, valves 31 and 32 are closed and valve 33 is opened. The warm media replaces the cold media through the storage chamber 35 to heat the chamber. This evaporates the gas reactant which will then be returned through valve 33 to the reaction chamber 10. While the gas reactant is being recycled into the reaction chamber 10, one or both of the cold traps 19 and 21 may be collecting further gas reactant exiting from the process chamber 10. The collection and transfer of unreacted gas product in cold trap 21 would occur in the same manner as for cold trap 19. Since the collection and transfer of gas product reactant can alternate between the first cold trap and the second cold trap 21 recovery and recycling of the gas reactant can be done continuously. The storage chamber 35 provides an efficient recycling system. Since the storage chamber 35 has only one input/output access pipe 34, during the recycling stage the gas reactant will exit in only one direction out of the storage chamber 35 and into the reaction chamber 10.

Equipment which is used for the recovery of xenon difluoride should be preferably made with a coating of nickel. The pipes, valves, cold traps, reaction chamber and storage chamber of the present invention are preferably lined with nickel. The nickel-lined equipment is pre-conditioned with fluorine to form a coating of nickel fluoride. The resulting tenacious and impervious coating of nickel fluoride does not react with xenon difluoride. The nickel fluoride coating will thus prolong the life of the equipment and will avoid undesirable consumption of XeF$_2$ etchant.

Of course, it should be understood that various changes and modifications to the preferred embodiments described above will be apparent to those skilled in the art. For example, the invention may be used for the recovery and recycling of a wide variety of condensable expensive or toxic reactants, including such gasses as silane or arsine. It is therefore intended that such changes falling within the spirit and scope of the invention be covered by the following claims.

What is claimed is:

1. A method for the recovery and recycling of noble gas halides comprising:

reacting a noble gas halide with a substrate in a reaction chamber;
condensing unreacted noble gas halide on a cold surface;
pumping away the remaining reaction products;
warming the cold surface; and
readmitting the noble gas halide obtained from the cold surface into the reaction chamber.

2. The method of claim 1 wherein said noble gas halide comprises xenon difluoride.

3. The method of claim 2 wherein said substrate comprises silicon.

4. The method of claim 2 wherein said reaction chamber and said cold surface are coated with a layer of nickel fluoride.

5. A method for continuous recovery and recycling of a condensable gas reactant comprising:

(a) continually reacting said gas reactant with a substrate in a reaction chamber;
(b) condensing unreacted condensable gas reactant on a cold surface in a first cold trap;
(c) pumping away remaining reaction products from said first cold trap;
(d) shutting off communication between said first cold trap and said reaction chamber;
(e) opening communication between a second cold trap and said reaction chamber;
(f) opening communication between said first cold trap and a cold storage chamber;
(g) warming said cold surface in said first cold trap so that said unreacted condensable gas reactant vaporizes, enters said storage chamber and condenses in said storage chamber;
(h) condensing unreacted condensable gas reactant on a cooled surface in said second cold trap;
(i) pumping away remaining reaction products from said second cold traps;
(j) shutting off communication between said storage chamber and said cold traps;
(k) opening communication between said storage chamber and said reaction chamber and warming said storage chamber;
(l) cooling said first cold trap;
(m) shutting off communication between said second cold trap and said reaction chamber;
(n) cooling said storage chamber;
(o) opening communication between said second cold trap and said cold storage chamber;
(p) warming said cooled surface in said second cold trap so that said unreacted condensable gas reactant vaporizes, enters said storage chamber and condenses in said storage chamber;
(q) shutting off communication between said storage chamber and said cold traps;
(r) opening communication between said storage chamber and said reaction chamber and warming said storage chamber;
(s) cooling said second cold trap;
(t) repeating steps (b) through (s).

6. The method of claim 5 wherein said condensable gas reactant comprises xenon difluoride.

7. The method of claim 6 wherein said substrate comprises silicon.

8. The method of claim 6 wherein said storage chamber and said cold traps are coated with a layer of nickel fluoride.

9. The method of claim 5 wherein said condensable gas reactant comprises silane.

10. The method of claim 5 wherein said condensable gas reactant is toxic.

11. The method of claim 10 wherein said condensable gas reactant comprises arsine.

12. An apparatus for the recovery and recycling of noble gas halides comprising:

a reaction chamber;

a cold trap, coupled with said reaction chamber;

pump means for pulling reaction products through said cold trap to empty said cold trap of reaction products;

first valve means connected between said reaction chamber and said cold trap for closing off said cold trap from said reaction chamber after condensing a noble gas halide in said cold trap;

second valve means connected between said cold trap and said pump means for closing off said cold trap from said pump means after said reaction products have been emptied from said cold trap;

means for warming said cold trap so that said noble gas halide may be recycled; and said first valve means opening to let said noble gas halide from said warmed cold trap back into said reaction chamber.

13. The apparatus of claim 12 wherein said noble gas halide comprises xenon difluoride.

14. The apparatus of claim 13 wherein said reaction chamber and said cold trap further comprise a coating of nickel fluoride.

15. An apparatus for continuous recovery and recycling of condensable gas reactants comprising:

a reaction chamber;

a plurality of cold traps, coupled with said reaction chamber;

pump means for pulling reaction products from said reaction chamber through said cold traps;

a storage chamber having a single opening for receiving gases from said cold traps and returning gases to said reaction chamber;

first valve means connected between said reaction chamber and each of said cold traps for closing off a cold trap from said reaction chamber after condensing a condensable gas reactant in said cold trap;

means for warming each of said cold traps to vaporize said condensable gas reactant which condensed in said trap;

second valve means associated with each of said cold traps for closing off its respective cold trap from said pump means;

third valve means for opening communication between each of said warmed cold traps and said storage chamber so that vaporized gas reactant will be directed from said warmed cold trap into said storage chamber; and fourth valve means for opening communication between said storage chamber and said reaction chamber while said third valve means closes communication between said cold traps and said storage chamber to recycle said gas reactant from said storage chamber into said reaction chamber.

16. The apparatus of claim 15 further comprising means for warming and cooling said storage chamber.

17. The apparatus of claim 15 wherein said condensable gas reactant comprises xenon difluoride.

18. The apparatus of claim 17 wherein said reaction chamber, said storage chamber and said plurality of cold traps further comprise a coating of nickel fluoride.

19. The apparatus of claim 15 wherein said condensable gas reactant comprises silane.

20. The apparatus of claim 15 wherein said condensable gas reactant is toxic.

* * * * *